United States Patent
Stolk et al.

(10) Patent No.: US 6,461,908 B2
(45) Date of Patent: Oct. 8, 2002

(54) METHOD OF MANUFACTURING A SEMICONDUCTOR DEVICE

(75) Inventors: Peter Adriaan Stolk; Pierre Hermanus Woerlee; Mathijs Johan Knitel, all of Eindhoven; Anja Catharina Maria Carolina Van Brandenburg, Heerlen, all of (NL)

(73) Assignee: Koninklijke Phillips Electronics N.V., Eindhoven (NL)

( * ) Notice: Subject to any disclaimer, the term of this patent is extended or adjusted under 35 U.S.C. 154(b) by 0 days.

(21) Appl. No.: 09/829,796

(22) Filed: Apr. 10, 2001

(65) Prior Publication Data

US 2001/0031522 A1 Oct. 18, 2001

(30) Foreign Application Priority Data

Apr. 12, 2000 (EP) .............................................. 00201317

(51) Int. Cl.$^7$ .......................................... H01L 21/8238
(52) U.S. Cl. ....................... 438/228; 438/231; 438/525; 438/530
(58) Field of Search ................................ 438/223, 224, 438/227, 228, 231, 232, 302, 525, 527, 530, 545, 546

(56) References Cited

U.S. PATENT DOCUMENTS

| | | | |
|---|---|---|---|
| 5,227,321 A | 7/1993 | Lee et al. | ...................... 437/44 |
| 5,904,520 A * | 5/1999 | Liaw et al. | .................. 438/231 |
| 5,930,615 A | 7/1999 | Manning | ..................... 438/232 |
| 6,187,619 B1 * | 2/2001 | Wu | ............................. 438/224 |

FOREIGN PATENT DOCUMENTS

JP  55013953  1/1980

* cited by examiner

*Primary Examiner*—Chandra Chaudhari
(74) *Attorney, Agent, or Firm*—Aaron Waxler

(57) ABSTRACT

A method of manufacturing a semiconductor device including a PMOS transistor (6) and an NMOS transistor (5) comprises the steps of:

(a) providing a semiconductor substrate (1) having a P-well region (3), which is to be provided with the NMOS transistor (5), and an N-well region (2), which is to be provided with the PMOS transistor (6);

(b) forming gate electrodes (8) on the P-well region (3) and the N-well region (2);

(c) applying a hard mask (10), which covers either the P-well region (3) or the N-well region (2);

(d) implanting a source and a drain in the region that is not covered by the hard mask (10), followed by heat activation;

(e) implanting pocket implants in the region that is not covered by the hard mask (10), followed by heat activation;

(f) removing the hard mask (10).

6 Claims, 2 Drawing Sheets

METHOD OF MANUFACTURING A SEMICONDUCTOR DEVICE

BACKGROUND OF THE INVENTION

The present invention relates to the manufacture of semiconductor devices, and especially to the provision of tools for the reduction of the minimum feature size of Metal Oxide Semiconductor Field Effect Transistors (MOSFETs) in integrated circuits (ICs). More in particular, the present invention relates to a technology enabling the separate formation of source/drain (S/D) junction and pocket counterdoping regions in MOS transistors without the need of extra masking steps.

The semiconductor industry continuously strives to reduce the minimum feature sizes of MOSFETs in integrated circuits. These attempts are essentially driven by the need to produce ICs at lower costs, while retaining or improving circuit functionality and speed. This downscaling can for instance be achieved by reducing the characteristic dimensions of the transistors present on these ICs, and especially the gate lengths, the gate oxide thickness and the junction depths, and by increasing the channel doping levels.

Short MOS transistors generally suffer from the so-called short-channel effect (SCE): the source and drain regions will approach each other when the gate length is reduced. This has an adverse effect on the switching of the transistors in the sense that the switching is less controlled by the gate electrode, which leads to an undesired decrease in the threshold voltage. This adverse effect can be explained by mechanism which causes the depletion regions around the source and the drain to occupy an increasingly large fraction of the channel region, so that a lower potential on the gate is needed to achieve inversion in the channel.

In the conventional MOSFET scaling scenarios, SCE has been kept within acceptable limits by reducing the junction depths and increasing the channel dopant concentration. These conventional scenarios, however, no longer work for sub-0.18 micron devices, because in these devices the suppression of SCE requires too high a doping level in the channel, which gives rise to junction breakdown.

A proposed solution to this problem is the use of pocket or halo counterdoping implants. Phosphorus, arsenic or antimony ions are used for pockets in PMOS transistors, while boron or indium ions are used for pockets in NMOS transistors. The pocket implants serve to raise the channel doping level in the immediate vicinity of the S/D regions. This leads to a net increase in the channel doping regions when the gate length is reduced, thereby suppressing the influence of the S/D depletion regions for short-channel devices, In standard MOS processing, and especially in conventional Complementary MOS processing, the pocket implantation step, which is also referred to as the halo implantation step, is combined with the S/D (extension) implantation step. During this combined implantation step, certain areas of the silicon wafers are covered with a patterned resist layer in order to avoid undesired implantation of these areas. For instance, PMOS transistors are covered during formation of NMOS transistors and vice versa. These pocket implants and S/D implants are activated in a single annealing step after removal of the said resist layer. The dopant diffusion during this annealing step determines the distribution of both the pocket dopants and the S/D dopants.

An example of a process wherein the size of a first diffusion region of a primary dopant and a halo diffusion region are adjusted by annealing is given in U.S. Pat. No. 5,227,321.

A disadvantage of this approach, wherein one annealing step is used to diffuse the dopants, is that the doping profiles of the pocket and the S/D regions cannot be independently tailored in order to improve the device performance.

Thus the possibility should be created to implant and anneal the pocket region and the S/D region separately and independently. This would provide the possibility to optimize the dopant distribution and thereby the short-channel performance.

A problem lies, however, in the fact that resist layers that cover part of the wafer during implantarion cannot be subjected to temperatures above 250° C. This means that fully separating pocket and S/D formation would require the use of extra resist masking steps, For a CMOS process, this would mean that two additional lithography steps are needed. The method of the present invention should not require additional masking or lithography steps, because such steps would extend and complicate the manufacturing process and thus significantly raise the costs of manufacture.

SUMMARY OF THE INVENTION

The present invention intends to overcome the problems as sketched for the conventional MOS transistor technology.

This object is achieved by using hard masking layers enabling the independent formation of pocket and S/D regions.

More in detail, the present invention relates to a method of manufacturing a semiconductor device including a PMOS transistor and an NMOS transistor comprising the steps of:

(g) providing a semiconductor substrate having a P-well region, which is to be provided with the NMOS transistor, and an N-well region, which is to be provided with the PMOS transistor;

(h) forming gate electrodes on the P-well region and the N-well region;

(i) applying a hard mask, which covers either the P-well region or the N-well region;

(j) implanting a source and a drain in the region that is not covered by the hard mask, followed by heat activation;

(k) implanting pocket implants in the region that is not covered by the hard mask, followed by heat activation;

(l) removing the hard mask.

Preferably, step (c) is effected by applying a hard mask layer, covering the hard mask layer with a resist layer, patterning this resist layer, and using the patterned resist layer as a mask for patterning the hard mask layer to form the hard mask.

The hard mask should be sufficiently thick to avoid penetration of the implanted dopants, and therefore advantageously has a thickness of at least 0.05 micron. The upper limit of the thickness of the hard mask is less critical. Sometimes the thickness is determined by economical considerations, as a result of the hard mask will not be very thick. In general, the thickness required for the hard mask depends on the chemical composition of the layer used to form the hard mask. This determines the penetration depth of the implanted ions. The use of a hard mask that is not too thick, for example a SiGe-hard mask having a thickness below 0.25 micron, preferably below 0.20 micron, has the additional advantage that the effect of ion shadowing that may occur during tilted pocket implants is reduced. Very good results are obtained by using for example a SiGe-hard mask having a thickness of about 0.15 micron.

Although several materials, especially several oxides, nitrides and oxynitrides, can be used for the hard mask, the hard mask advantageously comprises Ge-doped silicon, especially Ge-doped polycrystalline silicon (poly-$Si_{1-x}Ge_x$, which material can be deposited at temperatures of about 450° C. for x>0.3, and can withstand rapid thermal annealing conditions), Si-rich SiN or polycrystalline Ge. These materials can be applied by, for example, chemical vapour deposition and can be patterned by, for example, plasma etching. These materials can be removed very selectively from oxides and silicon by, for example, conventional wet etching.

BRIEF DESCRIPTION OF THE DRAWING

The present invention will be described in more detail with reference to FIGS. 1 to 5, which illustrate a suitable method according to the invention.

DETAILED DESCRIPTION OF THE PRIMARY EMBODIMENT

Figure 1:
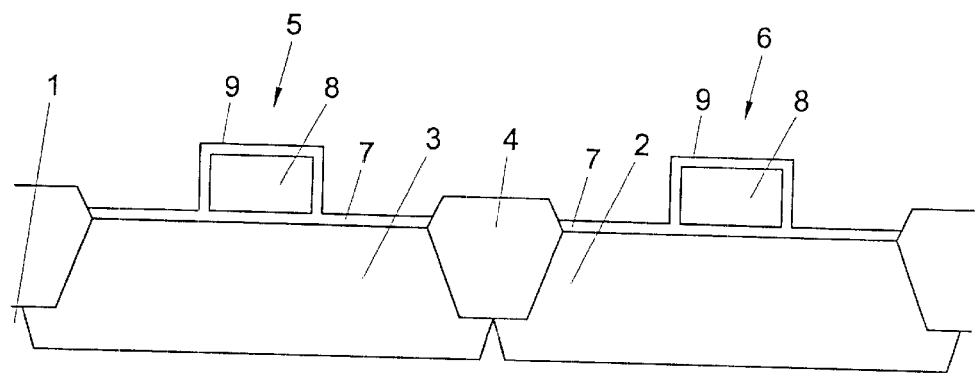

In FIG. 1 a silicon substrate 1 is shown, provided with an N-well region 2 and a P-well region 3, separated by a field isolation 4. The P-well region 3 is to be provided with an NMOS transistor 5, whereas the N-well region 2 is to be provided with a PMOS transistor 6. Both the P-well region 3 and the N-well region 2 are provided with a gate oxide 7 on which polysilicon gate electrodes 8 are formed. After formation of the polysilicon gate electrodes 8, a short oxidation step equivalent to a few nanometers of oxide growth is advantageously carried out to cover the silicon substrate and the polysilicon gate electrodes 8 with an oxide layer 9.

Figure 2:
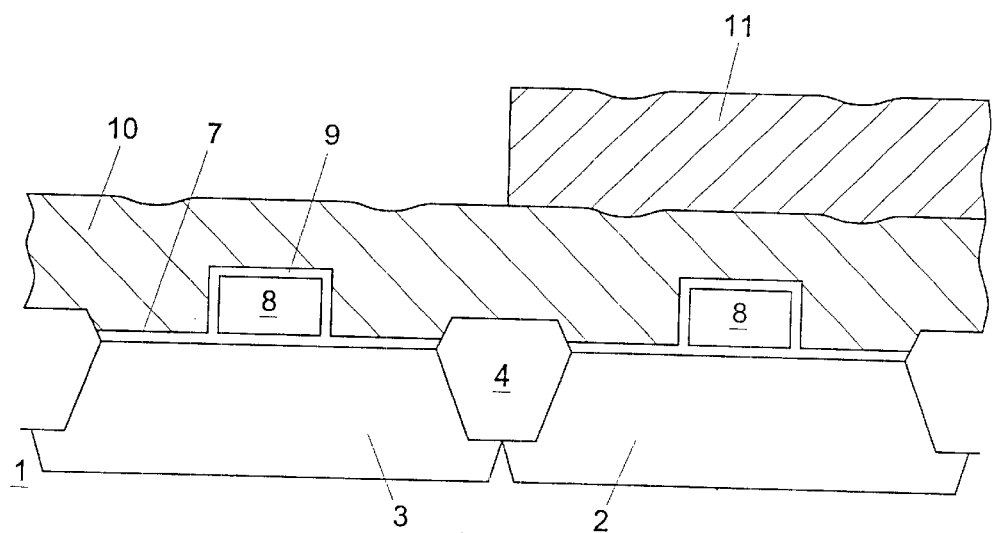
Figure 3:
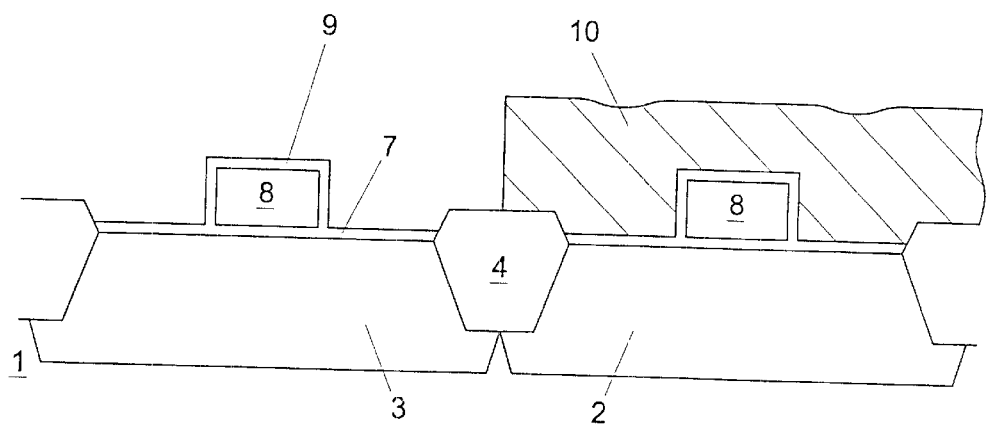

Then, a hard mask layer 10 (FIG. 2) of Ge-doped polycrystalline (poly-$Si_{0.65}Ge_{0.35}$) is applied by chemical vapour deposition at 450° C. The layer is applied in a thickness of about 0.15 micron. A customarily used photoresist layer 11 (thickness about 0.5 micron) is applied on top of the hard mask layer 10 and patterned using conventional lithography. The patterned resist layer 11 is used as a mask for patterning the hard mask layer 10 by means of plasma etching, the ultimate result of which is shown in FIG. 3.

Figure 4:
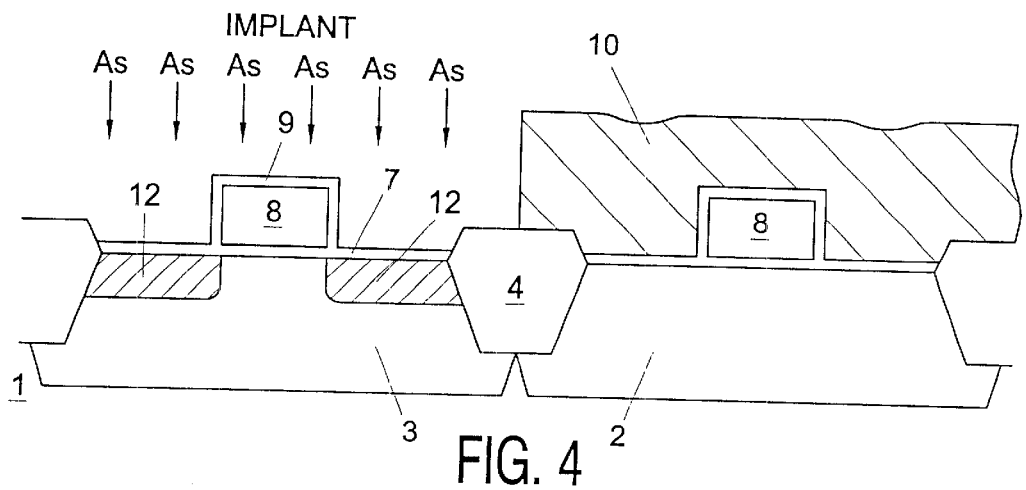
Figure 5:
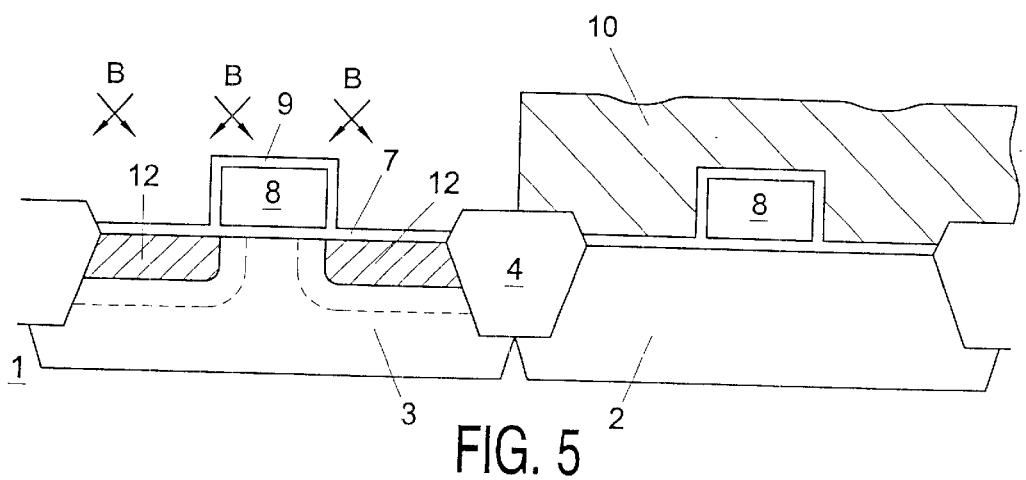

FIG. 4 shows the step wherein arsenic ions are implanted into the P-well region 3 at an energy in the range from 5 to 15 KeV and a dose in the range between 1E15 and 5E15 $cm^{-2}$, preferably between 3E14 and 1E15 $cm^{-2}$, which implantation step is followed by conventional annealing, thereby forming a source and a drain 12. FIG. 5 shows the pocket implantation using boron ions (15–30 KeV; 1E13–1E14 $cm^{-2}$) at a tilt angle of 20–40°, followed by an annealing step. The steps shown in FIGS. 4 and 5 can optionally be reversed, so that first a pocket implant/annealing is carried out followed by a source/drain implant/annealing.

Subsequently, the hard mask 10 is selectively removed from the wafer (not shown). If desired, The same steps as depicted in FIGS. 2 to 5 can be carried out for the N-well region 2, using B or $BF_2$ ions for the source/drain implant and As or P ions for the pocket implant.

Following the steps described hereinabove as part of the present invention, the selectively implanted structure is subjected to conventional further processing to complete the semiconductor device comprising the PMOS transistor and the NMOS transistor. More in particular, side wall spacers, generally of oxides or nitrides, are formed on the sides of the gate electrodes. Subsequently the NMOS area is selectively doped with, generally, arsenic, while using conventional mask technologies, and the PMOS area is selectively doped with, generally, boron. The NMOS and PMOS doping steps can be carried out in any order. Then, an annealing step is carried out to activate the doped regions. Finally, conventional silicidation and metallisation steps are carried out, which ultimately provide the desired semiconductor device.

What is claimed is:

1. A method of manufacturing a semiconductor device including a PMOS transistor and an NMOS transistor comprises the steps of:

(a) providing a semiconductor substrate having a P-well region, which is to be provided with the NMOS transistor, and an N-well region, which is to be provided with the PMOS transistor;

(b) forming gate electrodes on the P-well region and the N-well region;

(c) applying a hard mask, which covers either the P-well region or the N-well region;

(d) implanting a source and a drain in the region that is not covered by the hard mask, followed by heat activation;

(e) implanting pocket implants only in the region that is not covered by the hard mask, followed by heat activation;

(f) removing the hard mask.

2. A method as claimed in claim 1, wherein, prior to the application of the hard mask, a dielectric layer is applied covering the semiconductor substrate and the gate electrodes.

3. A method as claimed in claim 1, wherein step (c) is effected by applying a hard mask layer, covering the hard mask layer with a resist layer, patterning this resist layer, and using the patterned resist layer as a mask for patterning the hard mask layer to form the hard mask.

4. A method as claimed in claim 1, wherein the hard mask is applied in a thickness of at least 0.05 micron.

5. A method as claimed in claim 4, wherein the hard mask is applied in a thickness below 0.25 micron.

6. A method as claimed in claim 1, wherein the hard mask applied comprises Ge-doped silicon, Si-rich SiN or polycrystalline Ge.

\* \* \* \* \*